United States Patent
Lee

(10) Patent No.: US 8,034,681 B2
(45) Date of Patent: Oct. 11, 2011

(54) METHOD OF FORMING FLASH MEMORY DEVICE HAVING INTER-GATE PLUG

(75) Inventor: Yun Bong Lee, Chungbuk (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/830,102

(22) Filed: Jul. 2, 2010

(65) Prior Publication Data

US 2010/0304557 A1 Dec. 2, 2010

Related U.S. Application Data

(62) Division of application No. 11/477,981, filed on Jun. 28, 2006, now Pat. No. 7,750,384.

(30) Foreign Application Priority Data

Jun. 29, 2005 (KR) .................. 10-2005-0057268
May 18, 2006 (KR) .................. 10-2006-0044729

(51) Int. Cl.
*H01L 21/8234* (2006.01)

(52) U.S. Cl. ........ 438/238; 438/239; 438/386; 438/399; 257/314; 257/296; 257/E21.686; 257/E21.683

(58) Field of Classification Search .................. 257/314; 438/238
See application file for complete search history.

(56) References Cited

U.S. PATENT DOCUMENTS

| | | | |
|---|---|---|---|
| 5,095,344 A | 3/1992 | Harari | |
| 6,207,507 B1 | 3/2001 | Wang | |
| 6,297,084 B1 | 10/2001 | Joung et al. | |
| 6,395,590 B1 | 5/2002 | Leu | |
| 6,476,440 B1 * | 11/2002 | Shin | 257/316 |
| 6,853,028 B2 | 2/2005 | Kim et al. | |
| 2004/0079988 A1 | 4/2004 | Harari | |
| 2004/0129986 A1 | 7/2004 | Kobayashi et al. | |
| 2004/0166634 A1 | 8/2004 | Lee et al. | |

FOREIGN PATENT DOCUMENTS

| | | | |
|---|---|---|---|
| CN | 1277460 | | 12/2000 |
| JP | 09-074145 A | | 3/1997 |
| JP | 10289990 A | * | 10/1998 |
| JP | 11-195719 A | | 7/1999 |
| JP | 2000-277633 A | | 10/2000 |

* cited by examiner

*Primary Examiner* — Ajay K Arora

(74) *Attorney, Agent, or Firm* — Kilpatrick Townsend & Stockton LLP

(57) ABSTRACT

A method of forming a non-volatile memory device includes the following steps. First and second cell gates are formed in a cell region. First and second peripheral gates are formed in a peripheral-region. A first insulating layer is formed over the first and second cell gates and the first and second peripheral gates. A second conductive layer is formed over the first insulating layer. A third insulating layer is formed over the second conductive layer. Selected portions of the third insulating layer, the second conductive layer, and the first insulating layer are removed to form an inter-gate plug provided between the first and second cell gates. The inter-gate plug completely fills a space defined between the first and second cell gates.

8 Claims, 2 Drawing Sheets

METHOD OF FORMING FLASH MEMORY DEVICE HAVING INTER-GATE PLUG

CROSS-REFERENCE TO RELATED APPLICATIONS

The present invention is a divisional of U.S. patent application Ser. No. 11/477,981, filed on Jun. 28, 2006, which claims priority to Korean patent application numbers 10-2005-57268, filed on Jun. 29, 2005, and 10-2006-44729, filed on May 18, 2006, all of which are incorporated herein by reference in their entirety.

BACKGROUND

The present invention relates to a flash memory device, and more particularly to a flash memory device having inter-gate plugs to prevent a mutual interference between cell gates.

In general, a NAND flash memory device includes a plurality of cell blocks. Each cell block contains cell strings in which a plurality of cells for storing data is connected in series. A drain select transistor is provided between the cell string and the drain, and a source select transistor is provided between the cell string and the source.

A method of manufacturing a flash memory device in the related art will be described in short below. An isolation structure is formed on a semiconductor substrate by a Shallow Trench Isolation (STI) process, defining an active region and a field region.

A tunnel oxide film having a predetermined thickness is formed on the active region. A polysilicon film is formed on the tunnel oxide film. The polysilicon film is used as a conductive layer for a floating gate. A dielectric film is formed on the polysilicon film. The dielectric film is formed by sequentially laminating an oxide film, a nitride film, and an oxide film, thereby forming an ONO layer.

A second polysilicon film is formed on the dielectric film. This polysilicon film is used as a conductive layer for a control gate and is formed so that it is common to a plurality of unit cells.

The control gate also includes tungsten silicide deposited on the second polysilicon film to reduce the resistivity of the control gate. A gate hard mask is deposited on the tungsten silicide and gate lines are formed by photolithography and etch processes. Semiconductor devices are continuously being miniaturized and highly integrated. Accordingly, a cell's threshold voltage Vt may vary when the neighboring cells are being programmed due to a mutual interference between the cell gates. Such the mutual interference becomes more significant as the cells are reduced in size, e.g., cells of 100 nanometers or less.

SUMMARY OF THE INVENTION

An embodiment of the present invention relates to reducing threshold voltage Vt variation by forming inter-gate plugs and spacers.

In one embodiment of the present invention, a non-volatile memory device includes first and second cell gates formed in a cell region; first and second peripheral gates are formed in a peri-region; and an inter-gate plug is provided between the first and second cell gates. The inter-gate plug includes a first insulating layer, a second conductive layer formed over the first insulating layer, and a third insulating layer formed over the second conductive layer.

In one embodiment, the device includes a first inter-gate spacer formed between the first and second peripheral gates; and a second inter-gate spacer formed between the first and second peripheral gates. The first and second inter-gate spacers are configured to be floating while the first and second cells are being programmed. An upper surface of the inter-gate plug is flushed to an upper surface of the first and second cell gates. The first insulating layer includes a first vertical portion that is provided between the second conductive layer and the first cell gate and a second vertical portion that is provided between the second conductive layer and the second cell gate.

In another embodiment, a method of fabricating a flash memory device includes forming first and second cell gates in a cell region; forming first and second peripheral gates in a peri-region; forming a first insulating layer over the first and second cell gates and the first and second peripheral gates; forming a second conductive layer over the first insulating layer; forming a third insulating layer over the second conductive layer; and removing selected portions of the third insulating layer, the second conductive layer, and the first insulating layer, to form an inter-gate plug provided between the first and second cell gates. The inter-gate plug completely fills a space defined between the first and second cell gates. The removing step forms first and second inter-gate spacers that are provided between the first and second peripheral gates, respectively.

BRIEF DESCRIPTION OF THE DRAWINGS

A more complete appreciation of the invention and many of the attendant advantages will be readily apparent and better understood with reference to the following detailed description when considered in conjunction with the accompanying drawings in which like reference symbols indicate the same or similar components, wherein.

DETAILED DESCRIPTION OF EMBODIMENTS

Figure 1:
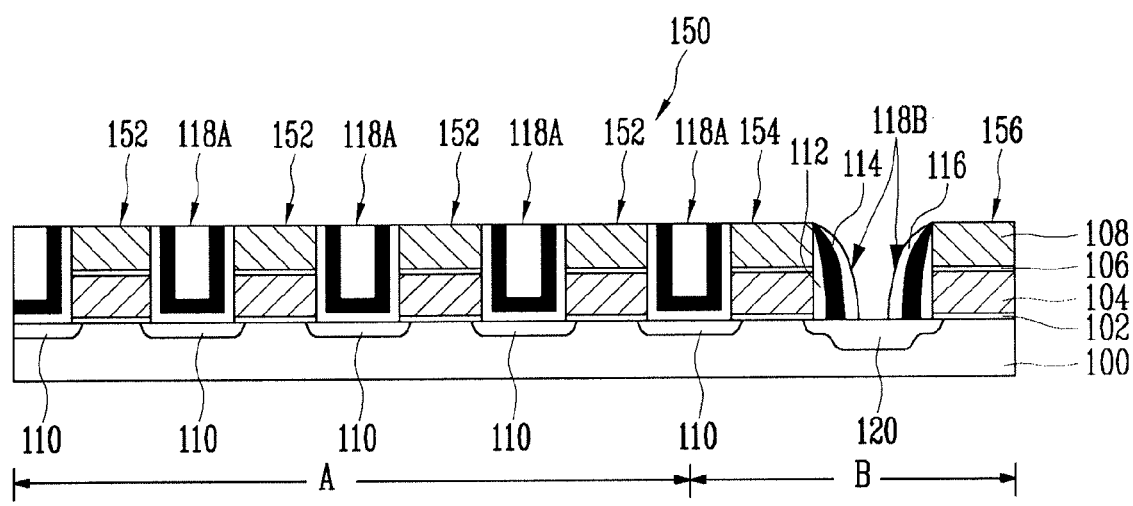
FIG. 1 is a cross-sectional view of a flash memory device according to an embodiment of the present invention.

Referring to FIG. 1, a flash memory device 150 includes a tunnel oxide film 102, a first conductive layer for a floating gate 104, a dielectric film 106, and a second conductive layer for a control gate 108 that are formed a semiconductor substrate 100. A plurality of gates 152 and is formed in a cell region A. Gates 154 and 156 are formed in a peri-region B A plurality of low-concentration ion implant regions 110 is formed in the cell region A. A high-concentration ion implantation region 120 is formed in the peri-region B.

Inter-gate plugs 118A are formed between the gates 152. Inter-gate spacers 118B are formed between gates 154 and 156 in the peri-region B. In the present embodiment, the inter-gate plugs 118A and spacers 118B are formed using substantially the same process. Each inter-gate plug/spacer includes a first oxide film 112, a conductive film 114, and a second oxide film 116. The conductive film 114 may be doped polysilicon (poly-Si).

The inter-gate plugs 118A are used to prevent a mutual interference between cell gates by applying a potential to the conductive film 114 during a program operation. As a result, the threshold voltage Vt variation of a transistor in the cell region A due to the mutual interference from the adjacent cell transistors is reduced.

During the program operation, the inter-gate spacer 118B provided on the sidewall of the gate of the select transistor 154. The select transistor 154 may be a source select transistor or a drain select transistor.

Figure 2A:
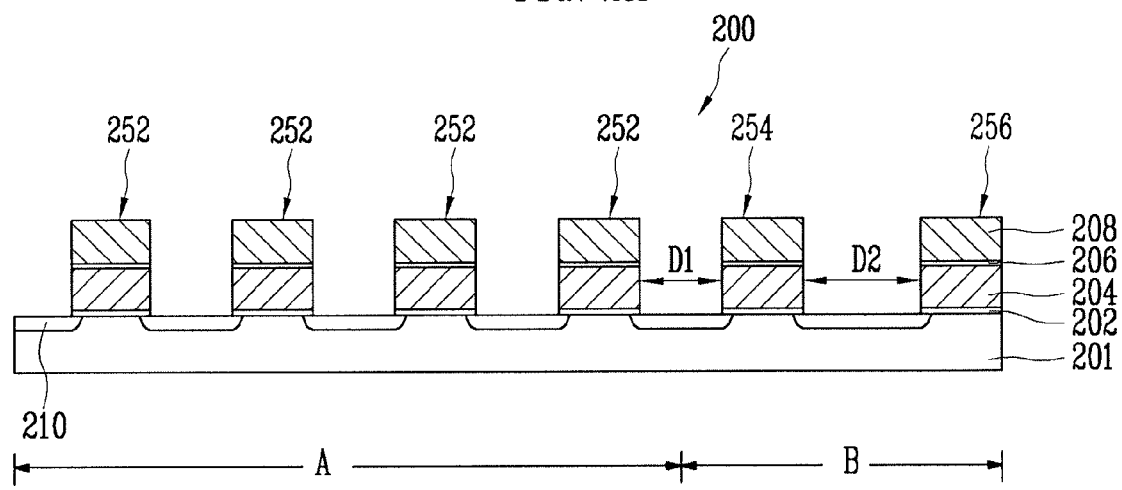
FIGS. 2A to 2C are cross-sectional view illustrating a method of fabricating a flash memory device according to an embodiment of the present invention.
Figure 2B:
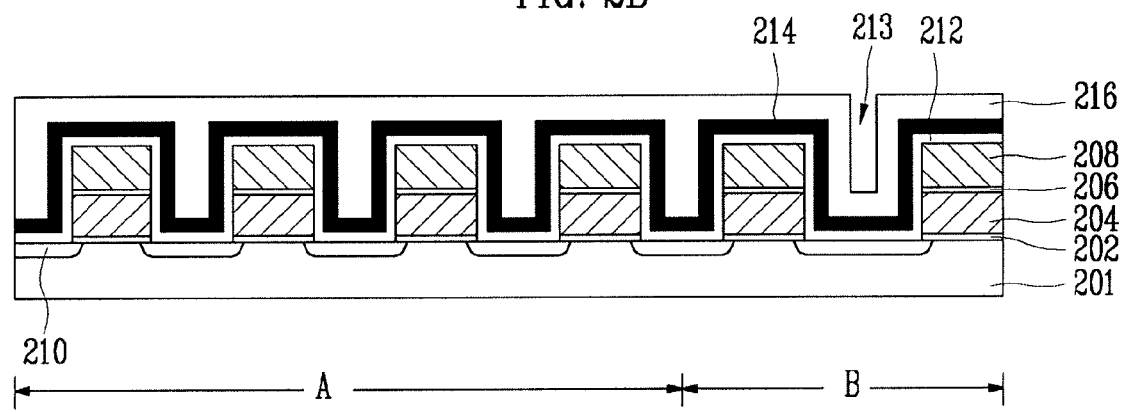
Figure 2C:
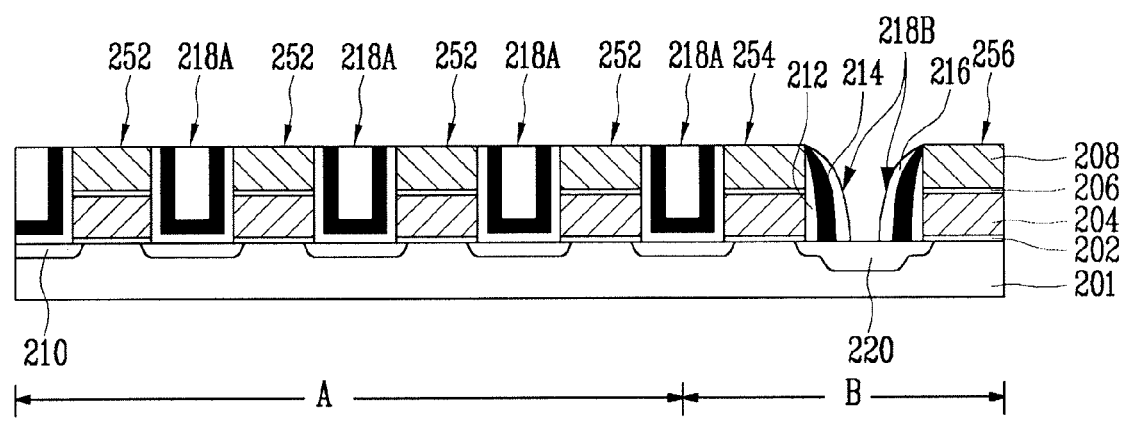

FIGS. 2A to 2C are cross-sectional view illustrating a method of fabricating a flash memory device according to an embodiment of the present invention.

Referring to FIG. 2A, a flash memory device (e.g., a NAND flash device) is formed on a semiconductor substrate 201 having a cell region A and a peri-region B. The device 200 includes a tunnel oxide film 202 and a first conductive layer for a floating gate 204. The first conductive layer 204 may be a polysilicon film.

The first conductive layer 204, the tunnel oxide film 202, and the semiconductor substrate 200 are etched to a predetermined depth by photolithography and etch processes employing an isolation mask, thus forming a trench (not shown). The trench defines an active region and a field region on the substrate 201.

An insulating film is formed on the entire structure to fill the trench. The insulating film is then polished, forming an isolation structure or shallow trench isolation (not shown). The isolation structure may be etched by a predetermined thickness so that the effective field oxide height (EFH) of the isolation structure can be controlled.

A dielectric film 206 is formed on the first conductive layer 206. In the present embodiment the dielectric film 206 includes an oxide film, a nitride film, and an oxide film that are sequentially laminated to form an ONO structure. A second conductive layer 208 is formed on the dielectric film 206 to form a control gate. The second conductive layer may be a polysilicon film, or a laminated structure of a polysilicon film and a silicide film (e.g., tungsten silicide).

The second conductive layer 208 and the dielectric film 206 are etched by photolithography and etch processes employing a cell gate mask having a shape orthogonal to the isolation structure (not shown). The underlying first conductive layer 204 is then etched. Cell gates 252 having floating gates and control gates are formed in the cell region A. The cell gates define an inter-gate distance of D1.

Peripheral gates 254 and 256 are formed in the peri-region B at this time the cell gates are formed. The peripheral gates define an inter-gate distance D2 that is larger than that of the cell gates. The peripheral gate 254 defines a source or drain select transistor.

Impurities are injected into the semiconductor substrate 201 using the gates as a mask to form low-concentration ion implant regions 210. These regions define the source and drain regions for the cell transistors Referring to FIG. 2B, a first oxide film 212 is formed over the substrate and the gates. The first oxide film includes first and second vertical portions that are provided on the sidewalls of the gates. In the present embodiment, the first oxide film 212 is formed by a re-oxidation process that is performed on the entire structure to protect the gate line and the exposed semiconductor substrate 201.

A conductive film 214 is formed on the first oxide film 212. The conductive film 214 is a polysilicon film in the present embodiment. A second oxide film 216 is formed on the entire structure.

As explained above, the distance D1 between the gates of the cell region A is less than the distance D2 between the gates in the peri-region B. In the present embodiment, the second oxide film 216 is formed to completely fill the inter-gate spaces defined between the gates of the cell region A while the inter-gate space defined by the gates of the peri-region B is not fully filled and has a space 213.

Referring to FIG. 2C, the second oxide film 216, the polysilicon film 214, and the first oxide film 212 are sequentially etched using different etchants by means of an etch-back process. These films may be removed using other methods, e.g., a chemical mechanical polishing method. At the cell region A, a plurality of inter-gate plugs 218A are formed since the second oxide film 216 had completely filled the inter-gate spaces defined by the cell gates. The vertical portions of the first oxide film separate the polysilicon film 214 and the gates 252.

At the peri-region B, inter-gate spacers 218B, capable of preventing the mutual interference between the gates, are formed at the peri-region B. The inter-gate spacers 218B each includes the first oxide film 212, the polysilicon film 214, and the second oxide film 216. The inter-gate spacers 218B expose a portion of the substrate 201.

Dopants are implanted into the substrate exposed by the inter-gate spacers 118B to define a high-concentration ion-implantation region 220 to form source/drain region for the gates 254 and 256.

A method of driving the flash memory device fabricated by the processes shown in FIGS. 2A to 2C will be described below.

Upon programming, power (Vcc) is applied to the polysilicon film 214 formed within the sidewall 218 of the cell region A, but the polysilicon film 214 formed within the sidewall 218 of the peri-region B is floated As described above, according to the present invention, when miniaturized flash memory cells are formed, mutual interference can be prevented and uniform threshold voltage obtained by forming inter-gate plugs between the cell gates. While neighboring cell transistors are being programmed, variations in cell properties, which is caused by threshold voltage Vt variations, can be prevented.

While the invention has been described in connection with what is presently considered to be specific embodiments, it is to be understood that the invention is not limited to the disclosed embodiments. For example, the present invention has been explained in terms of NAND flash memory devices, but NOR flash devices. The present invention includes various modifications and equivalent arrangements of the disclosed embodiments. The scope of the present invention should be interpreted using the appended claims.

What is claimed is:

1. A method of fabricating a flash memory device, the method comprising:
    forming first and second cell gates in a cell region of a semiconductor substrate, wherein the first and second cell gates each comprise a floating gate and a control gate;
    forming first and second peripheral gates in a peri-region;
    forming a first insulating layer over the first and second cell gates and the first and second peripheral gates;
    forming a second conductive layer over the first insulating layer;
    forming a third insulating layer over the second conductive layer;
    removing selected portions of the third insulating layer, the second conductive layer, and the first insulating layer, to form an inter-gate plug provided between the first and second cell gates, the inter-gate plug completely filling a space defined between the first and second cell gates.

2. The method of claim 1, wherein the removing step forms first and second inter-gate spacers that are provided between the first and second peripheral gates, respectively.

3. The method of claim 2, wherein the removing step involves an etching step.

4. The method of claim 2, wherein the removing step involves a polishing step.

5. The method of claim 2, wherein the first insulating layer is an oxide film, the second conductive layer is a polysilicon film, and the third insulating film is an oxide film.

6. The method of claim 2, wherein the second conductive layer of the inter-gate plug is configured to receive a given potential while first and second cell corresponding the first and second cell gates are being programmed.

7. The method of claim 6, wherein the second conductive layer of the first and second inter-gate spacer are configured to be floating while the first and second cells are being programmed.

8. The method of claim 7, wherein the first and second inter-gate spacers define a space therebetween.

* * * * *